United States Patent
Schoen (10) Patent No.: US 8,703,516 B2
(45) Date of Patent: Apr. 22, 2014

(54) MEMS SUBSTRATES, DEVICES, AND METHODS OF MANUFACTURE THEREOF

(75) Inventor: Florian Schoen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 202 days.

(21) Appl. No.: 12/173,537

(22) Filed: Jul. 15, 2008

(65) Prior Publication Data

US 2010/0013031 A1 Jan. 21, 2010

(51) Int. Cl.
*H01L 21/00* (2006.01)

(52) U.S. Cl.
USPC ............... 438/50; 438/52; 257/414; 257/415

(58) Field of Classification Search
USPC ............... 257/414, 415, E29.324, E29.166, 257/E29.001, E21.613; 438/50, 52
See application file for complete search history.

(56) References Cited

U.S. PATENT DOCUMENTS

| 5,372,952 A | 12/1994 | Aronowitz et al. |
| 5,744,719 A | 4/1998 | Werner |
| 5,747,353 A * | 5/1998 | Bashir et al. ............... 438/50 |
| 5,760,455 A | 6/1998 | Hierold et al. |
| 5,914,520 A | 6/1999 | Werner |
| 6,043,166 A | 3/2000 | Roitman et al. |
| 6,046,067 A | 4/2000 | Werner |
| 6,133,059 A | 10/2000 | Werner |
| 6,373,115 B1 | 4/2002 | Kolb et al. |
| 6,593,173 B1 * | 7/2003 | Anc et al. ............... 438/149 |
| 6,794,264 B2 | 9/2004 | Dolan et al. |
| 6,812,056 B2 | 11/2004 | Blanchard |
| 2001/0041395 A1 | 11/2001 | Ajmera et al. |
| 2005/0124167 A1 * | 6/2005 | Nevin et al. ............... 438/700 |
| 2007/0138395 A1 * | 6/2007 | Lane et al. ............... 250/353 |
| 2008/0242048 A1 * | 10/2008 | Nakai et al. ............... 438/440 |
| 2009/0072290 A1 * | 3/2009 | Cheng et al. ............... 257/303 |
| 2009/0152673 A1 * | 6/2009 | Kwon et al. ............... 257/522 |

FOREIGN PATENT DOCUMENTS

| DE | 198 39 123 C1 | 11/1999 |
| DE | 101 00 438 A1 | 7/2002 |
| DE | 102004060961 | 7/2006 |
| WO | WO 95/08775 | 3/1995 |
| WO | WO 95/09366 | 4/1995 |
| WO | WO 00/48245 A1 | 8/2000 |

* cited by examiner

*Primary Examiner* — Matthew Reames
*Assistant Examiner* — Farid Khan
(74) *Attorney, Agent, or Firm* — Slater & Matsil, L.L.P.

(57) ABSTRACT

Micro-electromechanical system (MEMS) substrates, devices, and methods of manufacture thereof are disclosed. In one embodiment, a MEMS device includes a workpiece having an isolation ring in a top portion thereof, and a moveable element disposed within the isolation ring.

28 Claims, 5 Drawing Sheets

MEMS SUBSTRATES, DEVICES, AND METHODS OF MANUFACTURE THEREOF

TECHNICAL FIELD

The present invention relates generally to the fabrication of micro-electromechanical system (MEMS) devices, and more particularly to MEMS substrates, devices, and methods of manufacture thereof.

BACKGROUND

MEMS devices comprise a relatively new technology that combines semiconductors with very small mechanical devices. MEMS devices are micro-machined sensors, actuators, and other structures that are formed by the addition, subtraction, modification, and patterning of materials using techniques originally developed for the integrated circuit industry. MEMS devices are used in a variety of applications, such as in sensors for motion controllers, inkjet printers, airbags, microphones, and gyroscopes, as examples. The applications that MEMS devices are used in continue to expand and now also include applications such as mobile phones, automobiles, global positioning systems (GPS), video games, consumer electronics, automotive safety, and medical technology, as examples.

Manufacturing MEMS devices is challenging in many aspects. Fabricating small moving parts of MEMS devices with lithography processes used in semiconductor technology has limitations in some applications.

Some MEMS devices are fabricated on silicon-on-insulator (SOI) substrates. However, SOI substrates are more expensive than bulk substrates; thus, lower cost MEMS devices would be achievable if MEMS devices were to be manufactured on bulk substrates.

Thus, what are needed in the art are improved substrates for MEMS devices, methods of manufacture thereof, and more cost-effective MEMS devices and methods of manufacture thereof.

SUMMARY OF THE INVENTION

These and other problems are generally solved or circumvented, and technical advantages are generally achieved, by embodiments of the present invention, which provide novel MEMS devices and methods of manufacture thereof, wherein a MEMS region is formed on a bulk substrate by implanting a substance such as oxygen or nitrogen locally into the substrate, and an isolation ring is formed above and around a perimeter of the oxidized or nitrided implantation region.

In accordance with an embodiment of the present invention, a MEMS device includes a workpiece having an isolation ring in a top portion thereof, and a moveable element disposed within the isolation ring.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments of the present invention and are not necessarily drawn to scale.

DETAILED DESCRIPTION OF ILLUSTRATIVE EMBODIMENTS

The making and using of the various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Some devices requiring MEMS devices are fabricated based on a "system in a package" approach, where MEMS devices and application specific integrated circuit (ASIC) devices are formed on different wafers and packaged together in a single package. However, in some applications, it is desirable to integrate a silicon MEMS device having a moveable element such as a resonator together with an ASIC device, such as a complementary metal oxide semiconductor (CMOS) device or bipolar CMOS (biCMOS) device, together on the same wafer. To manufacture a MEMS device, a sacrificial layer such as silicon dioxide is needed below a moveable element of a MEMS device, in order to release the moveable element from the bulk material.

One conventional method of integrating a MEMS device together with an ASIC on the same wafer is to use an SOI wafer as a base material. An SOI wafer comprises an oxide layer formed on a bulk substrate, and a thin silicon layer is bonded to the oxide layer. When used in a MEMS device, the insulating oxide layer of the SOI wafer is used as a sacrificial layer, enabling the formation of moveable elements such as resonators for MEMS devices from monocrystalline silicon. However, the ASIC device is also formed on the small top silicon layer of the SOI wafer, which may result in transistors formed on the thin top silicon layer suffering from depletion and displaying a different behavior than on bulk material. Furthermore, an SOI wafer is three to five times more expensive than a bulk silicon wafer, substantially increasing the cost of the MEMS and ASIC devices.

Another conventional method of integrating a MEMS device together with an ASIC on the same wafer is to manufacture the moveable element of the MEMS device from polycrystalline material rather than monocrystalline material. A less costly bulk monocrystalline wafer is used, and an oxide layer is deposited on the wafer. A polycrystalline layer of silicon (e.g., a polysilicon layer) is deposited on top of the sacrificial oxide layer. However, polysilicon resonators suffer from higher losses due to the grain boundaries of the polycrystalline material. As, a result, the quality factor of resonators manufactured from polysilicon is much lower than the quality factor of resonators formed having the same geometry yet formed from monocrystalline material. Furthermore, the mechanical properties of the polysilicon layer are a function of the deposition conditions and therefore pose a source of process-induced inaccuracy of the MEMS devices.

Thus, what are needed in the art are improved substrates for MEMS devices, methods of manufacture thereof, and improved MEMS devices and methods of manufacture thereof.

Embodiments of the present invention achieve technical advantages by providing novel MEMS substrates, devices, and methods of manufacture thereof. MEMS regions are formed locally on a bulk semiconductor wafer using an implantation process to form a buried insulating material beneath a top surface of the wafer. The MEMS regions are isolated from other portions of the workpiece using isolation rings formed over a perimeter of the buried insulating material. MEMS devices may be manufactured in the MEMS device regions on the same wafer or workpiece as ASIC devices using the substrates described herein.

The present invention will be described with respect to embodiments in specific contexts, namely implemented in MEMS devices comprising moveable elements that comprise resonators. Embodiments of the invention may also be implemented in other applications such as MEMS devices comprising sensors, actuators, accelerometers, and other MEMS structures having floating or moveable parts and elements, for example.

FIGS. 1 through 8 show cross-sectional views of a method of manufacturing or processing a substrate for a MEMS device at various stages in accordance with an embodiment of the present invention, wherein a substance is implanted into a portion of a bulk semiconductor workpiece 102, forming a buried insulating material 114, and an isolation ring 128 is formed over a perimeter of the buried insulating material 114.

Figure 1:
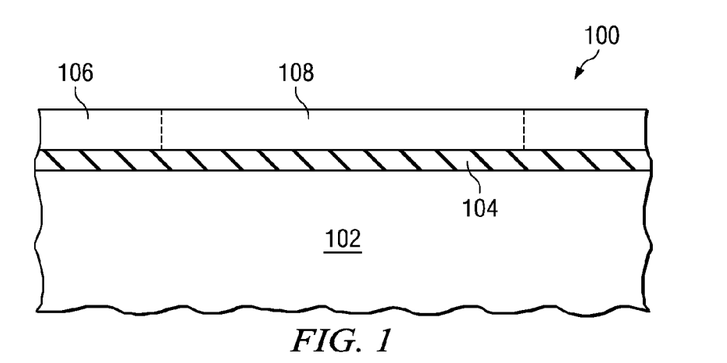
FIGS. 1 through 8 show cross-sectional views of a method of manufacturing a substrate for a MEMS device at various stages in accordance with an embodiment of the present invention, wherein a substance is implanted into a portion of a workpiece, forming a buried insulating material, and an isolation ring is formed over a perimeter of the buried insulating material.

Referring first to FIG. 1, to fabricate the MEMS device or semiconductor device 100, a workpiece 102 is provided. The workpiece 102 may include a semiconductor substrate or body comprising silicon or other semiconductor materials covered, for example. The workpiece 102 may also include other active components or circuits, not shown. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise single crystal silicon or monocrystalline silicon, in some embodiments, for example. The workpiece 102 may comprise a bulk silicon wafer or material or a bulk semiconductor wafer in some embodiments, as examples.

A first hard mask 104 is formed over the workpiece 102, as shown in FIG. 1. The first hard mask 104 may comprise a nitride material such as silicon nitride in some embodiments, for example, although alternatively, the first hard mask 104 may comprise other materials. The first hard mask 104 may comprise an insulating material such as silicon dioxide or multiple layers of silicon dioxide and silicon nitride in other embodiments, as another example. The first hard mask 104 may comprise a thickness of about 100 nm or greater, although alternatively, the first hard mask 104 may comprise other dimensions.

A first layer of photosensitive material 106 is formed over the first hard mask 104, as shown in FIG. 1. The first layer of photosensitive material 106 may comprise a photoresist, for example. The first layer of photosensitive material 106 is patterned using lithography, e.g., using a lithography mask and exposing a portion of the first layer of photosensitive material 106 to energy using the lithography mask to form a pattern 108 in the first layer of photosensitive material 106. The first layer of photosensitive material 106 is developed, and exposed portions of the first layer of photosensitive material 106 are removed.

Figure 2:
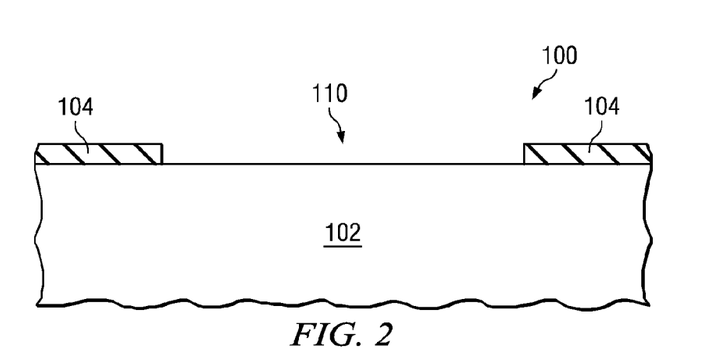

The first layer of photosensitive material 106 is used as a mask to remove or etch away exposed portions of the first hard mask 104, forming a first pattern 110 in the first hard mask 104, as shown in FIG. 2. Portions of the first hard mask 104 may be etched away using dry or wet chemical etching, for example. The first layer of photosensitive material 106 is then stripped or removed.

The first pattern 110 in the first hard mask 104 defines a MEMS device region wherein a buried insulating material 114 (see FIG. 3) will be formed, wherein the buried insulating material 114 may be removed later to release a moveable element of a MEMS device, to be described further herein. Thus, the first pattern 110 comprises an open window in the first hard mask 104 for an implantation process 112 that forms a buried insulating material 114 in the workpiece 102.

Figure 3:
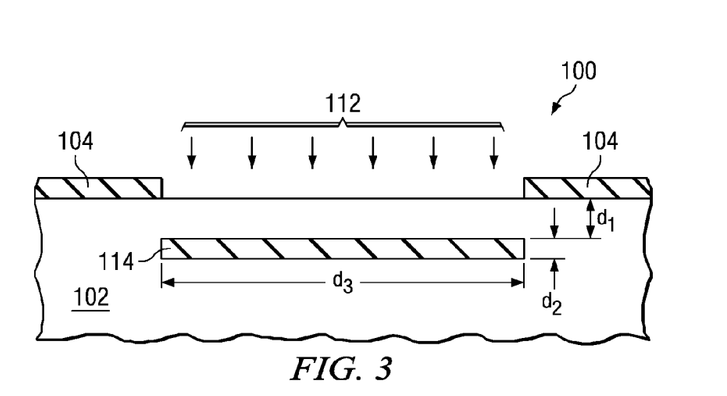

The workpiece 102 is exposed to an implantation process 112, as shown in FIG. 3. The implantation process 112 comprises implanting a substance into the workpiece 102 below a top surface of the workpiece 102, forming a buried insulating layer 114 beneath the top surface of the workpiece 102. In some embodiments, the implantation process 112 comprises ion implantation of oxygen (e.g., implanting oxygen ions), and the buried insulating layer 114 formed comprises a buried oxide layer 114 comprising an oxide material, for example. However, in some embodiments, the implantation process 112 may comprise ion implantation of nitrogen, and the buried insulating layer 114 formed may comprise a buried nitride layer 114 comprising a nitride material, as another example.

Because portions of the workpiece 102 are masked by the first hard mask 104, the implantation process 112 comprises a local implantation process, wherein only a MEMS device region of the workpiece 102 is implanted with the substance to form the buried insulating layer 114. Thus, some regions of the workpiece 102 advantageously do not have a buried insulating layer 114 formed therein, allowing the fabrication of non-MEMS devices in a later processing step or a preceding processing step in some embodiments, for example.

The implantation process 112 may comprise a relatively high dose implantation step, e.g., comprising a dose of about $1\times10^{17}$ cm$^{-2}$ to about $5\times10^{17}$ cm$^{-2}$ in some embodiments. The implantation process 112 may comprise a relatively low energy, e.g., about 60 to 150 keV, to avoid causing damage to the workpiece 102. Alternatively, the implantation process 112 may comprise other doses and energy levels.

The workpiece 102 is heated to complete the formation of the buried insulating layer 114 and to repair or restore the crystalline structure of the workpiece 102 and the buried insulating layer 114 after the implantation process 112. Heating the workpiece 102 may comprise one or several anneal steps in a furnace or one or more rapid thermal processing (RTP) steps, for example. Heating the workpiece 102 may comprise annealing the workpiece 102 in a furnace, subjecting the workpiece 102 to an RTP, or both annealing the workpiece 102 in a furnace and subjecting the workpiece 102 to an RTP, after implanting the substance into the portion of the workpiece 102 not protected by the first hard mask 104. The anneal process or RTP may comprise a temperature of about 1,000 degrees C. to about 1,200 degrees C., as examples, although alternatively, the workpiece 102 may be heated at other temperatures.

The buried insulating layer 114 may comprise a depth or dimension $d_1$ below the top surface of the workpiece 102 of about 50 nanometers (nm) or greater, for example, although dimension $d_1$ may alternatively comprise other dimensions. In some embodiments, dimension $d_1$ may comprise about 100 nm or greater, and may comprise several hundred nm. In some embodiments, the ion implantation process 112 parameters are dimensioned in a way that a sharp oxygen profile is generated in a distance or dimension $d_1$ of several hundred nm up to a micrometer (μm) or greater, as another example. The buried insulating layer 114 may comprise a thickness or dimension $d_2$ in a vertical direction of about 100 nm or less, for example, although dimension $d_2$ may alternatively comprise other dimensions. The buried insulating layer 114 may comprise a width or dimension $d_3$ in a horizontal direction of about 1 μm or greater, for example, although dimension $d_3$ may alternatively comprise other dimensions. The buried insulating layer 114 may comprise a dimension $d_3$ of about several hundreds of μms to about 1 mm in some embodiments, as examples. The dimensions $d_1$, $d_2$, and $d_3$ may vary as a function of the design and size of the MEMS device to be fabricated, for example.

Figure 12:
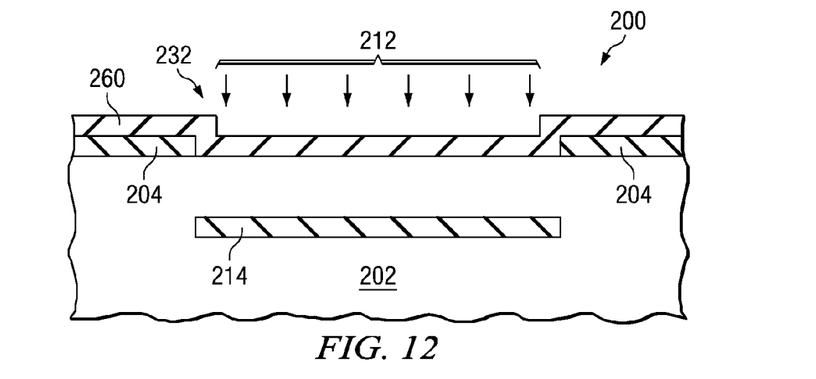
FIG. 12 shows a cross-sectional view of another embodiment of the present invention, wherein an optional screening insulating material is formed over the workpiece before the substance is implanted into the workpiece to form the buried insulating material.
Figure 13:
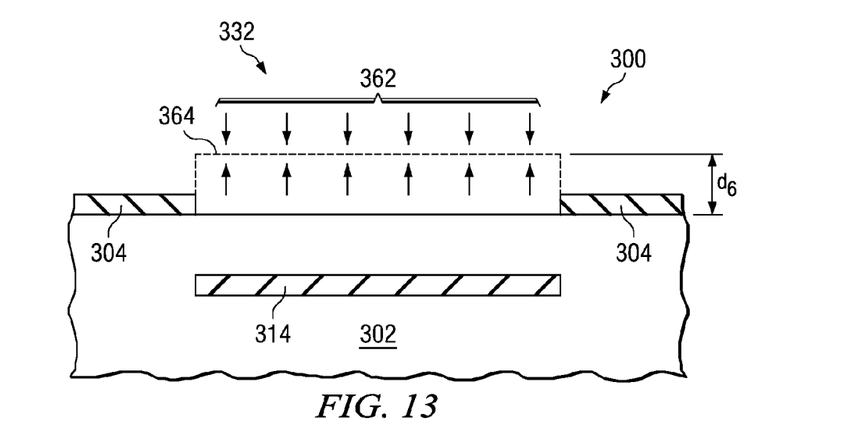
FIGS. 13 and 14 show cross-sectional views of yet another embodiment of the present invention, wherein an epitaxial growth process is used to increase the thickness of the workpiece over the buried insulating material in the MEMS region.

In some embodiments, a screening insulating material may be formed over the patterned first hard mask 104 before the implantation process 112, as shown in FIG. 12 at 260, to be described further herein. In other embodiments, the thickness of a top portion of the workpiece 102 at least disposed over the buried insulating material 114 may be increased using an epitaxial growth process, as shown in FIG. 13 at 362, also to be described further herein.

Next, the first hard mask 104 is removed, e.g., using an etch process selective to the workpiece 102. The first hard mask 104 may be removed using a wet chemical etch process, as an example, although alternatively, other removal methods may used.

Figure 4:
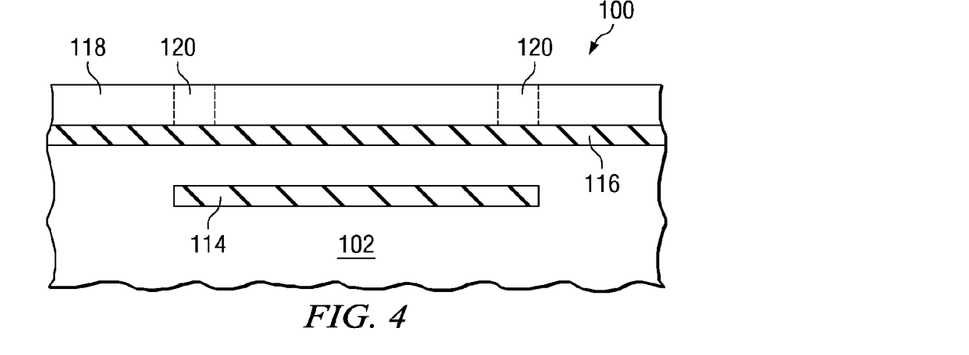

A second hard mask 116 is formed or deposited over the workpiece 102, as shown in FIG. 4. The second hard mask 116 may comprise similar materials and dimensions as described for the first hard mask 104, for example.

A second layer of photosensitive material 118 is formed over the second hard mask 116, as shown in FIG. 1. The second layer of photosensitive material 118 may comprise a photoresist, for example. The second layer of photosensitive material 118 is patterned using lithography, e.g., using a lithography mask and exposing a portion of the second layer of photosensitive material 118 to energy using the lithography mask to form a pattern 120 in the second layer of photosensitive material 118. The second layer of photosensitive material 118 is developed, and exposed portions of the second layer of photosensitive material 118 are removed.

Figure 5:
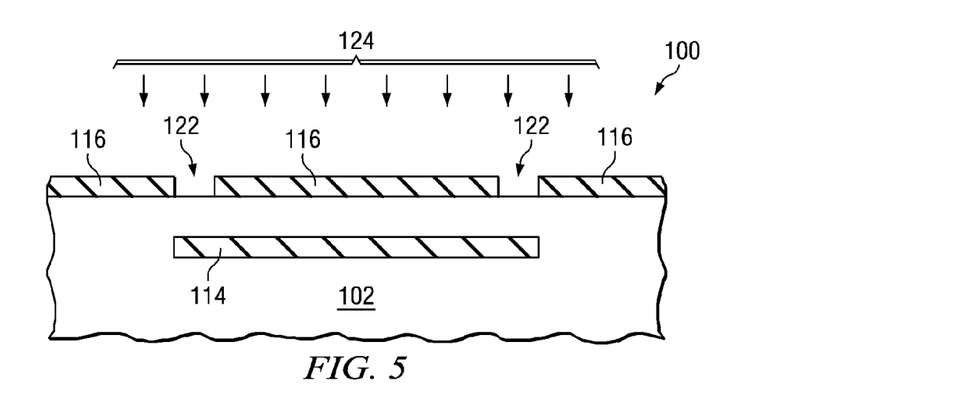

The second layer of photosensitive material 118 is used as a mask to remove or etch away exposed portions of the second hard mask 116, forming a second pattern 122 in the second hard mask 116, as shown in FIG. 5. Portions of the second hard mask 116 may be etched away using dry or wet chemical etching, for example. The second layer of photosensitive material 118 is then stripped or removed.

The second pattern 122 in the second hard mask 116 defines the shape of an isolation ring 128 (see FIG. 8) that will be formed over a perimeter of the buried insulating material 114 in a portion of the top surface of the workpiece 102 in accordance with embodiments of the present invention.

Figure 6:
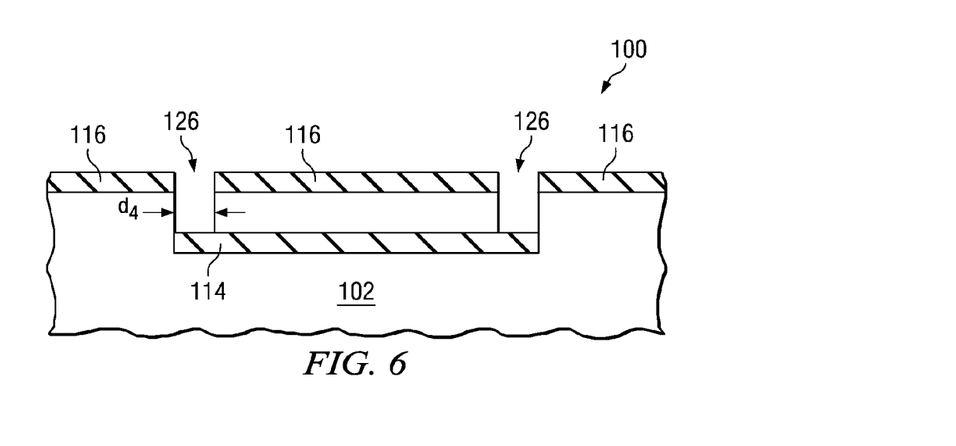

The workpiece 102 is etched using the second hard mask 116 as a mask, as shown in FIG. 5, forming a pattern 126 in an upper portion of the workpiece 102 over the buried insulating material 114 at the edges or perimeter of the buried insulating material 114, as shown in FIG. 6. The etch process 124 may comprise an anisotropic reactive ion etch (RIE) process, as an example, although alternatively, other types of etch processes may also be used to form the pattern 126. The etch process 124 may be adapted to stop on the material of the buried insulating material 114, for example. If the buried insulating material 114 comprises an oxide material, the etch process 124 may comprise an etch process adapted to stop on an oxide material, for example. If the buried insulating material 114 comprises a nitride material, the etch process 124 may comprise an etch process adapted to stop on a nitride material, as another example.

The pattern 126 in the top portion of the workpiece 102 comprises a ring-shaped trench or trench ring 126 surrounding and disposed over the perimeter of the buried insulating material 114. At least one side of the ring-shaped trench 126 may comprise a width or dimension $d_4$ of about 200 nm or greater in a cross-sectional view, in some embodiments. In other embodiments, the sides of the ring-shaped trench 126 may comprise a width or dimension $d_4$ of about 2 to 3 μm, for example. The width of the trench ring 126 comprises a dimension $d_4$ that is large enough to provide electrical and mechanical isolation of a MEMS device formed within the trench ring 126 from adjacent devices in the workpiece 102, for example. The width of the sides of the trench ring 126 also may comprise a dimension $d_4$ that is large enough to facilitate filling the trench ring 126 adequately with a fill material 128 (see FIG. 7), as another example.

The pattern 126 of the trench ring may comprise a square, rectangular, circular, elliptical, octagonal, polygonal, or trapezoidal shape when viewed from a top view of the workpiece 102, for example. As an example, in FIG. 9, a perspective view is shown of an embodiment of the present invention wherein the pattern 126 of the trench ring comprises a square shape.

Figure 7:
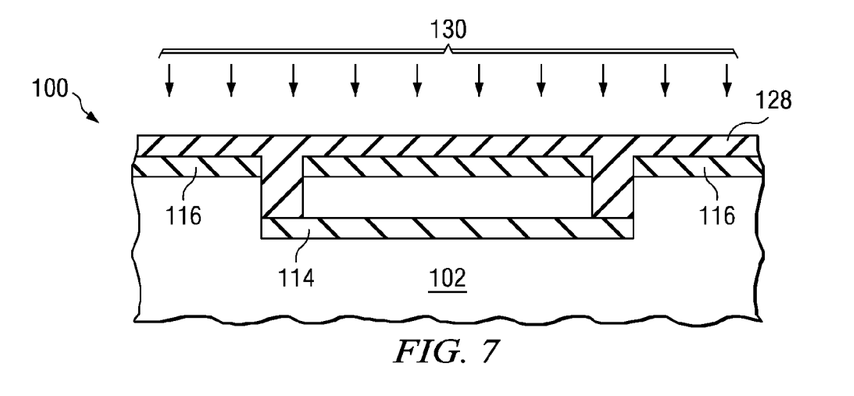

The pattern 126 comprising the trench ring is filled with a fill material 128 comprising at least one material comprising an insulator, as shown in FIG. 7. The fill material 128 may comprise an insulating material in some embodiments, for example. The insulating material may comprise silicon dioxide or silicon nitride, as examples, although alternatively, the fill material 128 may comprise other materials. In some embodiments, the fill material 128 may comprise one or more layers of an insulating material and a layer of semiconductive material such as polysilicon disposed over the insulating material(s), as another example. The fill material 128 for the trench ring 126 may comprise an oxide material, a nitride material, multiple layers or combinations thereof, or multiple layers or a combination thereof with polysilicon, for example.

The fill material 128 may comprise at least a first liner or a first layer that comprises a material with an etch selectivity to the material of the buried insulating material 114 in some embodiments. For example, if the buried insulating material 114 comprises silicon dioxide, the fill material 128 may comprise a first liner or first layer comprising silicon nitride. The fill material 128 may also comprise a single material layer of silicon nitride, for example. Alternatively, if the buried insulating material 114 comprises silicon nitride, the fill material 128 may comprise a first liner or first layer comprising silicon dioxide or the fill material may comprise a single material layer of silicon dioxide, for example. Providing an etch selectivity between the buried insulating material 114 and the fill material 128 provides the ability to remove the buried insulating material 114 without removing the fill material 128 in subsequent processing steps, for example.

Figure 8:
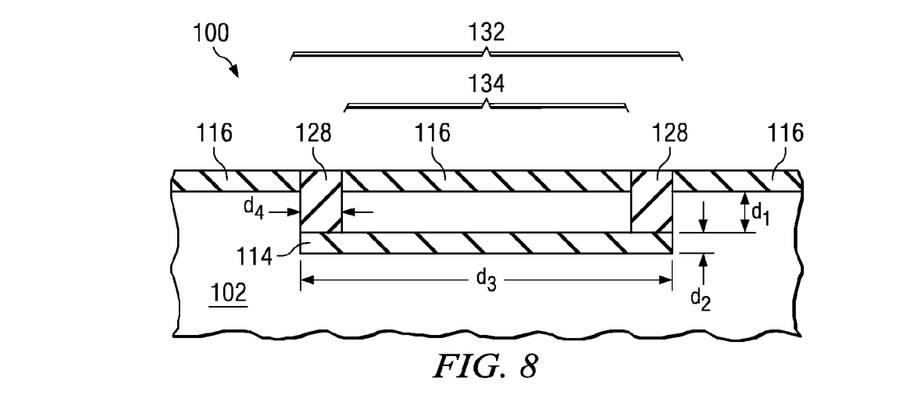

A chemical mechanical polish (CMP) process 130 is used to remove excess portions of the fill material 128 from the top surface of the second hard mask 116, as shown in FIG. 7, leaving the fill material 128 in the trench ring 126 and forming an isolation ring 128 comprising the fill material, as shown in FIG. 8. The CMP process 130 may be adapted to stop on the second hard mask 116, for example. If the second hard mask 116 comprises silicon nitride and the fill material 128 comprises silicon dioxide, the CMP process 130 may be adapted to stop on silicon nitride, as one example.

The exterior edges of the isolation ring 128 define a region 132 in the workpiece 102 for a MEMS device. A MEMS device is later fabricated or formed within the interior region 134 of the MEMS device region 132, to be described further herein. The MEMS device region 132 comprises a "sandbox" or a dedicated region within the workpiece 102 for the formation of a MEMS device. The MEMS device region 132 is advantageously isolated from adjacent regions in the workpiece 102 by the isolation ring 128 in a lateral direction and from lower portions of the workpiece 102 by the buried insulating material 114, for example.

Figure 9:
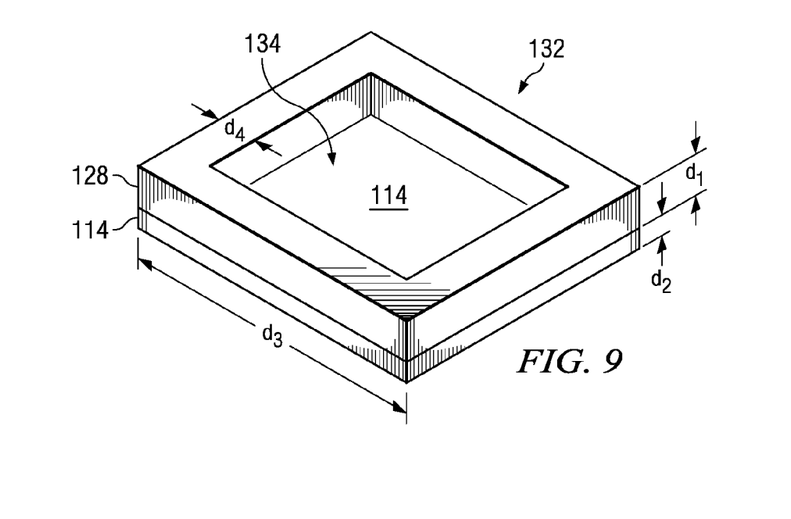
FIG. 9 shows a perspective view of the isolation ring and buried insulating material of the MEMS device region shown in FIG. 8.

FIG. 9 shows a perspective view of the isolation ring 128 and the buried insulating material 114 of the MEMS device region 132 shown in FIG. 8. In the embodiment shown in FIG. 9, the isolation ring 128 comprises a square shape in a top view; alternatively, the isolation ring 128 may comprise other shapes, as previously described herein. The workpiece 102 and the second hard mask 116 are not shown in FIG. 9 to more clearly show the isolation ring 128 and the buried insulating material 114.

Thus, FIGS. 1 through 9 illustrate a method of manufacturing a substrate in accordance with an embodiment of the present invention. A method of preparing a substrate for the fabrication of a MEMS device is also disclosed, e.g., in the MEMS device region 132. A substance is implanted into a portion of the workpiece 102, forming a buried insulating material 114 beneath the top surface of the workpiece. The top portion of the workpiece 102 is patterned over a perimeter of the buried insulating material 114. At least a portion (e.g., a lower portion and sidewalls) of the patterned top portion of the workpiece 102 is filled with at least one insulating material to form the isolation ring 128.

In accordance with one embodiment of the present invention, a substrate includes a workpiece 102 and a buried insulating material 114 disposed beneath the top surface of a portion of the workpiece 102, e.g., in the MEMS device region 132. The isolation ring 128 is disposed over the perimeter of the buried insulating material 114. The buried insulating material 114 and the isolation ring 128 comprise a microelectromechanical system (MEMS) device region of the workpiece 102.

Figure 10:
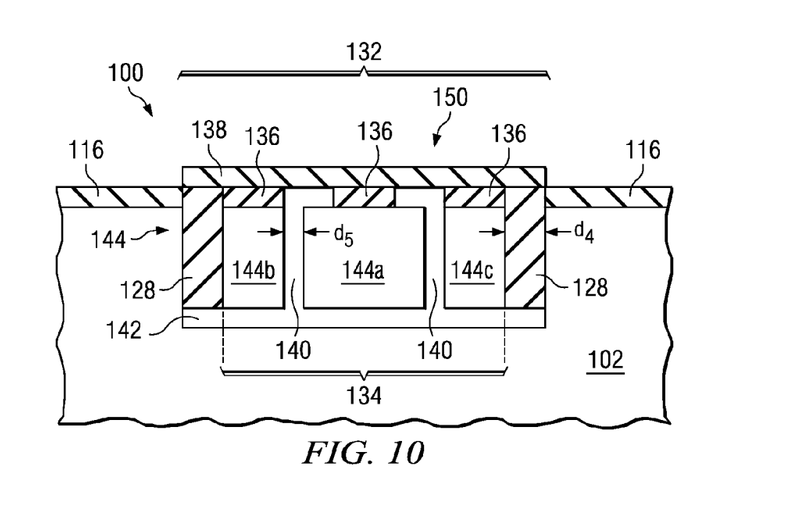
FIG. 10 shows a cross-sectional view of a MEMS device manufactured within the MEMS device region comprising the isolation ring, wherein the buried insulating material is removed through release holes formed in a top portion of the workpiece.

Embodiments of the present invention also include MEMS devices manufactured on the substrates prepared and fabricated as described herein. For example, in one embodiment, a MEMS device 150 includes a workpiece 102 comprising an isolation ring 128 in a top portion thereof, and a moveable element 144a disposed within the isolation ring 128, as shown in FIG. 10. In FIG. 10, a cross-sectional view of a MEMS device 150 is shown manufactured within the MEMS device region 132 comprising the isolation ring 128, wherein the buried insulating material 114 (not shown in FIG. 10; see FIGS. 8 and 9) has been released through release holes 140 formed in the top portion of the workpiece 102 disposed over the buried insulating material 114.

The release holes 140 may comprise trenches that extend in and out of the paper by many nm to a few μm, for example, releasing the central region 144a of the top portion 144 of the workpiece 102 in the MEMS device region 132 from portions 144b and 144c which remain affixed to the isolation ring 128 and other portions of the MEMS device 150 such as material layers 136 and 138. The MEMS device 150 may be manufactured using one of many methods known in the art for MEMS processing, for example.

As one example, to form the release holes 140 on at least two sides of the central region 144a of the top portion 144 of the workpiece 102 comprising the moveable element 144a, the hard mask 116 may be patterned and used as a mask to form the release holes 140. Or the hard mask 116 may be removed from over the MEMS device region 132, and an additional material layer 136 may be formed over the MEMS device region 132, patterned, and used as a mask to form the release holes 140, as another example. At least two release holes 140 are formed in the top portion 144 of the workpiece 102 over the buried insulating material 114. The release holes 140 may comprise a smaller width or dimension $d_5$ than the width or dimension $d_4$ of the sides of the trench ring 126 for the isolation ring 128. The release holes 140 may comprise a width or dimension $d_5$ of about 50 to 100 nm, as examples, although alternatively, the release holes 140 may comprise other dimensions.

At least a portion of the buried insulating material 114 is then removed from within the workpiece 102, e.g., using an etch process, leaving a void 142 where the buried insulating material 114 was, beneath the top portion 144 of the workpiece 102 over the void 142. The etch process to remove the at least the portion of the buried insulating material 114 may comprise a wet chemical etch process, for example, although other types of etch processes may also be used. The etchant of the etch process enters into the release holes 140 in the top portion 144 of the workpiece 102 and moves through the release holes 140, etching away and removing portions of the buried insulating material 114 beneath the top portion of the workpiece 102.

The width or dimension $d_5$ of the release holes 140 may be varied and chosen as a function of the amount of buried insulating material 114 that it is desired to remove. For example, it may be desirable to leave a portion of the buried insulating material 114 left residing under the isolation ring 128 and/or under at least portions of regions 144b and 144c of the top portion 144 of the workpiece 102 (not shown in the Figures). Thus, the width or dimension $d_5$ of the release holes 140 may be made narrower in such embodiments, for example. The width or dimension $d_5$ of the release holes 140 may also be varied and chosen as a function of the distance desired between stationary portions of the MEMS device 150 (e.g., regions 144b and 144c) and the central region or moveable element 144a.

The MEMS device 150 may be encapsulated with additional material layers such as layer 138 that comprises an insulating material. Material layers 136 and 138 comprise anchoring and encapsulating material layers of the MEMS device 150, for example.

The central region 144a (also referred to herein as a moveable element 144a) of the top portion 144 of the workpiece 102 over the void 142 may be anchored at the top to insulating material layer 136 at one or more locations, as shown in the view in FIG. 10. The central region 144a does not contact insulating material layer 136 in other regions of the top portion 144 of the workpiece 102 (not shown), e.g., in other cross-sectional views along the MEMS device 150. Thus, the central region 144a of the top portion 144 of the workpiece 102 comprises a moveable element 144a formed over the void 142 within the isolation ring 128, for example. The released and floating central regions 144a of the workpiece 102 are completely released, forming a moveable element 144a comprising the workpiece 102 material that floats above the void 142 and between the release holes 140. Portions of the moveable element 144a are not connected to the workpiece 102 and may move freely within the MEMS device 150. A top surface of the workpiece 102 below the void 142 proximate the moveable element 144a in the vertical direction, a bottom surface of material layer 138 in the vertical direction, and side surfaces of the workpiece 102 near the release holes 140 in the horizontal direction may function as mechanical stops for the moveable element 144a, or may prevent damage to the moveable element 144a and the MEMS device 150 during handling, by limiting or controlling the movement of the moveable element 144a, for example.

Regions 144b and 144c of the top portion 144 of the workpiece 102 above the void 142, e.g., on the left and right side of the moveable element or center region 144a, may comprise electrodes of the MEMS device 150 in some embodiments, for example. The electrodes 144b and 144c are adjacent the isolation ring 128 and are advantageously thus isolated from the workpiece 102.

The moveable element 144a may comprise a resonator in accordance with some embodiments of the present invention. The moveable element 144a may also comprise other movable parts and elements used in MEMS devices 150, for example. The moveable element 144a may comprise an oscillating element, an actuator, a sensor, a switch, an accelerometer, or other types of movable elements, as examples.

Figure 11:
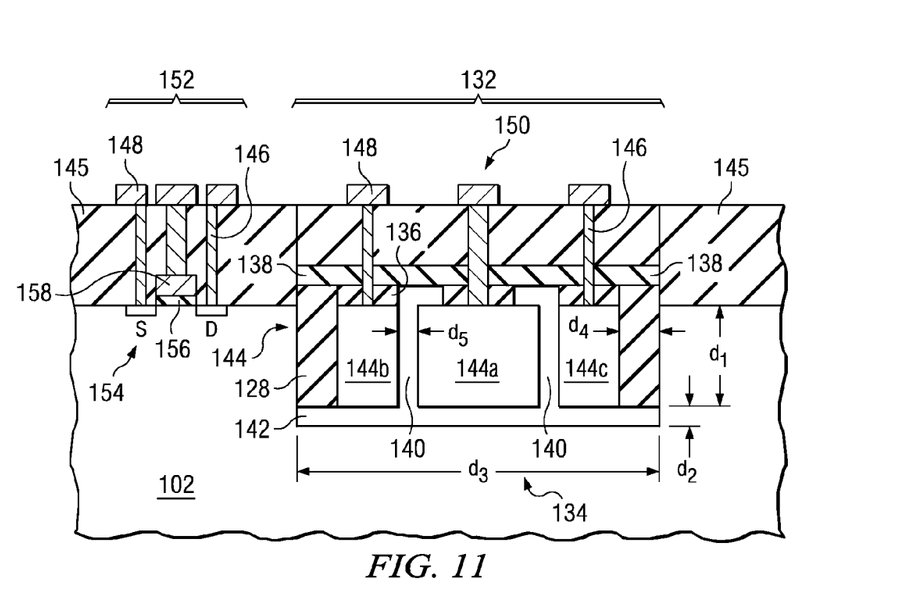
FIG. 11 shows a cross-sectional view of a MEMS device formed in the MEMS region, wherein a transistor is formed in another region of the workpiece.

Only a portion of the moveable element 144a is shown in the embodiment illustrated in FIGS. 10 and 11. The moveable element 144a may extend in and out of the paper by a few hundred nm to several µm, as examples, depending on the application. The moveable element 144a may comprise a variety of shapes in a top view, for example. The moveable element 144a may comprise the shape of a square, rectangle, ellipse, octagon, polygon, or trapezoid in a top view of the MEMS device 150, as examples, although other shapes may also be used. The moveable elements 144a may also comprise the shape of a fork, e.g., similar to a tuning fork.

One or more optional anchors (such as portion 136 of a material layer disposed over the moveable element 144a in FIG. 10) may be disposed above or below the moveable element 144a, for example. The anchors may be coupled to the moveable element 144a along the length, at the edges, or at other locations. If the moveable element 144a comprises a resonator, as an example, the resonator may be anchored at each end and the middle portion of the resonator may be allowed to move freely above the void 142 and below material layer 138 (because material 136 is not present over the freely moving portions of the resonator). Alternatively, the resonator may comprise an anchor 136 only at one end, as another example. The resonator may alternatively be anchored at a substantially central position, with ends of the resonator being released on either side of the central position, for example, not shown.

Advantageously, the novel buried insulating material 114 comprises a locally formed sacrificial layer that is surrounded by the isolation ring 128. The sacrificial buried insulating material 114 may be completely or partially removed during the formation of the MEMS device 150, so that no or little stress is generated by the buried insulating material 114 within the workpiece 102.

The MEMS device region 132 may comprise a first region of a workpiece 102 in some embodiments, for example. The workpiece 102 may also comprise a second region 152, as shown in FIG. 11 in a cross-sectional view. The second region 152 may comprise a region for a CMOS device in some embodiments, for example. Only one first region 132 and one second region 152 are shown in FIG. 11; however, a plurality of first regions or MEMS regions 132 and a plurality of second regions or CMOS regions 152 may be formed across a surface of a workpiece 102 in accordance with embodiments of the present invention.

A CMOS device 154 may be formed in the second region 152 of the workpiece 102, after forming the MEMS device 150 in the first region 132 in some embodiments, for example. After the processing or fabrication of the MEMS device 150, the second hard mask 116 may be removed from the second region 152 of the workpiece 102, and the CMOS device 154 may be fabricated using typical processing methods used to form CMOS devices 154, for example. In other embodiments, the CMOS device 154 may be formed in the second region 152 of the workpiece 102 before forming the MEMS device 150 in the first region 132, as another example, before the formation of the first hard mask 104 used in the fabrication process of the MEMS device 150 and MEMS region 152.

The CMOS device 154 may comprise a transistor, as shown, comprising a source region S and a drain region D formed in the workpiece 102. A gate dielectric 156 is formed over a channel region between the source region S and the drain region D, and a gate 158 is formed over the gate dielectric 156. The CMOS device 154 may comprise a biCMOS or other type of transistor, for example. Alternatively, the CMOS device 154 may comprise other types of elements or devices.

After the manufacturing process steps to prepare the MEMS device region 132, fabricate the MEMS device 150, and the CMOS device 154, other manufacturing process steps may then be completed to make electrical contact to portions of the MEMS device 150 and the CMOS device 154 and/or encapsulate the MEMS device 150 and the CMOS device 154. Vias 146 comprising a conductive material may be formed in insulating materials 145 formed over the workpiece 102, and electrical contacts 148 may be formed over the vias 146, as shown. The electrical contacts 148 may comprise portions of metallization lines or bond pads, for example. The vias 146 and contacts 148 provide electrical connections for the CMOS device 154 and the MEMS device 150, for example. One or more metallization layers may be used to form electrical connections of the semiconductor device 100, for example.

Again, in accordance with embodiments of the present invention, a portion of the moveable element 144a is released at the top and does not include an anchoring material 136 adjacent a top surface thereof; thus, the central region 144a of the top portion 144 of the workpiece 102 above the void 142 comprises a moveable element 144a. The electrodes 144b and 144c are coupled to vias 146 and electrical contacts 148 to provide electrical connection to the MEMS device 150. One or more anchored ends of the moveable element 144a may also be coupled to a via 146 and an electrical contact 148, as shown in the view in FIG. 11. Vias 146 and electrical contacts 148 may also be coupled to the gate 158, source region S, and drain region D of the transistor in the CMOS region 152, as shown.

FIG. 12 shows a cross-sectional view of another embodiment of the present invention, wherein an optional screening insulating material 260 is formed over the workpiece 202 before the substance is implanted into the workpiece 202 to form the buried insulating material 214. Like numerals are used for the various elements that were used to describe FIGS. 1 through 11. To avoid repetition, each reference number shown in FIG. 12 is not described again in detail herein. Rather, similar materials may be used for the various material layers x02, x04, x06, x08, etc. . . . that were used to describe FIGS. 1 through 11, where x=1 in FIGS. 1 through 11 and x=2 in FIG. 12. As an example, the materials and dimensions described for the buried insulating material 114 in the description for FIGS. 1 through 11 may also be used for the buried insulating material 214 shown in FIG. 11.

The screening insulating material 260 may comprise a thin layer of silicon dioxide, e.g., comprising a thickness of about 10 to 30 nm, as an example. Alternatively, the screening insulating material 260 may comprise a thickness of a few nm, e.g., about 10 nm or less, and may comprise other materials. The screening insulating material 260 is formed over the workpiece 202 after the patterning of the first hard mask 204, before the implantation process 212 used to form the buried insulating material 214. The use of the optional screening insulating material 260 may prevent channelling during the implantation process 212, for example. If included in the process flow, the screening insulating material 260 is removed before the first hard mask 204 is removed, after the implantation process 212 used to form the buried insulating material 214.

Figure 14:
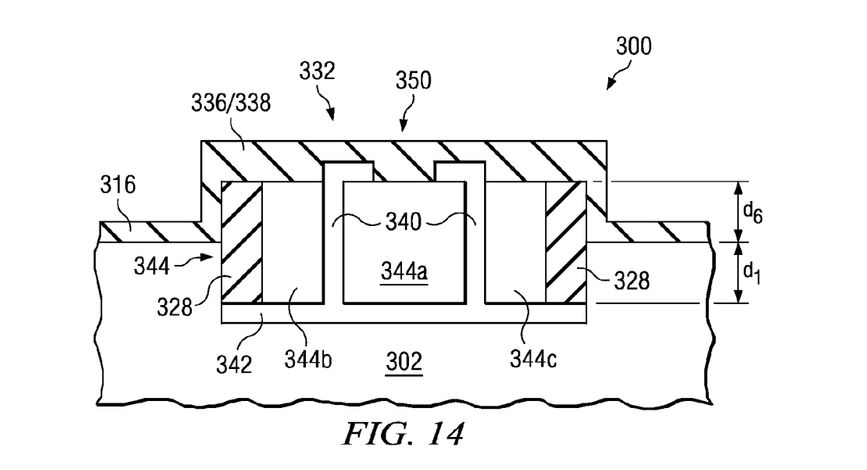

FIGS. 13 and 14 show yet another embodiment of the present invention, wherein an optional epitaxial growth process 362 is used to increase the thickness of the workpiece 302 in at least the MEMS region 332. Again, like numerals are used for the various elements that were used to describe the previous figures, and to avoid repetition, each reference number shown in FIGS. 13 and 14 is not described again in detail herein.

After the implantation process used to form the buried insulating material 314, the thickness of the device layer, e.g., the top portion 344 of the workpiece 302 over the buried insulating material 314 may be thin, because the depth of the implantation process may be limited by the implantation energy that is used for the implantation process in some embodiments. If a thicker device layer is needed for a MEMS device 350 in the MEMS region 332, the top portion of the workpiece 302 may be made thicker using an epitaxial growth process 362, either locally or over the entire workpiece 302.

For example, to locally increase the thickness of the workpiece 302 only in the MEMS device region 332, the first hard mask 304 may be left remaining over the workpiece 302, and the workpiece 302 may be subjected to an epitaxial growth process 362. The epitaxial growth process 362 may comprise placing the workpiece 302 in a chamber and introducing precursors and carrier gases that result in the increase of the thickness of the semiconductive material, e.g., the silicon, of the workpiece 302, raising the top surface 364 of the MEMS device region 332 above the other regions of the workpiece 302, as shown in FIG. 13. The top surface of the workpiece 302 may be increased by an amount or dimension $d_6$ of several nm, several hundred nm, up to about a μm or greater in some embodiments, as examples. Dimension $d_6$ may comprise a thickness of about 10 nm to about 15 μm in some embodiments, for example. Thus, the thickness of the top portion of the workpiece 302 that the MEMS device 350 is formed in after the epitaxial growth process 362 may comprise a thickness of dimensions $(d_1+d_6)$. The processing of the MEMS device 350 is then continued, e.g., central portions 344a of the top portion 344 of the workpiece 302 in the MEMS device region 332 are released, and anchoring and encapsulating materials 336/338 are formed over the MEMS device 350 as described for the previous embodiments herein.

Thus, in the embodiment shown in FIGS. 13 and 14, CMOS devices formed in other regions of the workpiece 302 may comprise a top surface that is lower than a top surface 364 in the MEMS device region 332.

Alternatively, the hard mask 304 may be removed before the epitaxial growth process 362, not shown, and the workpiece 302 may be globally exposed to the epitaxial growth process 362 to increase the height of the top surface 364 of the workpiece 302 by an amount or dimension $d_6$, for example. Thus, CMOS devices formed in other regions of the workpiece 302 comprise a top surface having substantially the same height as the top surface 364 in the MEMS device region 332 in these embodiments.

Embodiments of the present invention include novel MEMS devices 150 and 350 and methods of manufacturing the MEMS device 150 and 350 described herein. Embodiments of the present invention also include substrates for MEMS devices 150 and 350, methods of manufacturing the substrates, and methods of preparing substrates for the fabrication of MEMS devices 150 and 350, for example. Embodiments of the present invention also include methods of manufacturing the MEMS devices 150 and 350 described herein.

Advantages of embodiments of the invention include providing substrates for MEMS devices 150 and 350 that comprise dedicated regions 132, 232, and 332 for MEMS devices 150 and 350 to be formed in, that are isolated from other regions 152 of the workpiece 102, 202, and 302 by isolation rings 128 and 328, so that CMOS devices 154, other types of devices, or non-MEMS devices may be fabricated in other regions 152 of the same workpiece 102, 202, and 302.

Embodiments of the present invention are easily implementable into existing manufacturing process flows for MEMS devices 150 and 350, with few additional processing steps being required for implementation of the invention, for example. The workpieces 102, 202, and 302 comprise bulk silicon wafers, which are inexpensive; thus, the need for expensive SOI wafers is avoided.

Embodiments of the present invention advantageously provide a "localized SOI area" comprising the MEMS device regions 152, 252, and 352 that is electrically isolated from other regions of the workpiece 102, 202, and 302 by the isolation rings 128 and 328.

The moveable elements 144a and 344a of the MEMS devices 150 and 350 described herein are advantageously comprised of single or monocrystalline silicon, improving the performance characteristics of the MEMS devices 150 and 350. The moveable elements 144a and 344a may comprise a shape of a beam, wheel, plate, or other shapes, and may be implemented in electrostatically driven MEMS devices 150 and 350, for example. MEMS devices 150 and 350 may be fabricated using the techniques described herein that have a low motional resistance and a high quality factor, and that are adapted to operate at standard CMOS compatible operating voltages.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a micro-electromechanical system (MEMS) device, the method comprising:
    forming a buried insulating material by selectively implanting oxygen or nitrogen into a first region of a substrate, a top surface of the buried insulating material being vertically spaced apart from the top surface of the substrate;
    forming a trench ring by removing a top portion of the substrate over a perimeter of the buried insulating material;
    filling at least a portion of the trench ring with at least one insulating material to form an isolation ring in the top portion of the substrate;
    using an epitaxial growth process to locally increase a thickness of the top portion of the substrate in the first region but not a second region of the substrate, the second region being adjacent to the first region and the second region not comprising the buried insulating material;
    forming a moveable element in the top portion of the substrate within the isolation ring; and
    forming a complementary metal oxide semiconductor (CMOS) device in the second region of the substrate.

2. The method according to claim 1, wherein the substrate comprises single crystal silicon.

3. The method according to claim 1, wherein forming the moveable element comprises forming at least one release hole proximate the moveable element and removing at least a portion of the buried insulating material through the at least one release hole, forming the moveable element comprising the top portion of the substrate within the isolation ring.

4. The method according to claim 1, wherein the epitaxial growth process increases the thickness of the top portion of the substrate over at least the buried insulating material by about 10 nm to about 15 μm.

5. The method according to claim 1, further comprising annealing the substrate in a furnace, subjecting the substrate to a rapid thermal process (RTP), or both annealing the substrate in a furnace and subjecting the substrate to an RTP, after implanting the nitrogen into the portion of the substrate.

6. The method according to claim 1, wherein forming the moveable element comprises forming the moveable element in the first region of the micro-electromechanical system (MEMS) device.

7. A method of manufacturing a micro-electromechanical system (MEMS) device, the method comprising:
    implanting nitrogen only into a first region but not into a second region of a substrate thereby forming an isolation ring in a top portion of the first region of the substrate;
    using an epitaxial growth process to locally increase a thickness of the top portion of the substrate in the first region but not the second region of the substrate;
    forming a moveable element within the isolation ring; and
    forming a transistor in the second region of the substrate, the transistor laterally spaced from the moveable element.

8. The method according to claim 7, wherein forming the moveable element comprises forming the moveable element in a central region of the top portion of the substrate, wherein a void is disposed beneath the moveable element and beneath at least one release hole proximate the moveable element.

9. The method according to claim 7, further comprising forming an anchor adjacent at least one portion of the moveable element.

10. The method according to claim 7, wherein the moveable element comprises a resonator, an oscillating element, an actuator, a sensor, a switch, or an accelerometer.

11. A method of manufacturing a semiconductor device, the method comprising:
    implanting oxygen or nitrogen into a first region but not into a second region of a substrate thereby directly forming a buried insulating material beneath a top surface of the substrate in the first region, the first region being proximate the second region;
    using an epitaxial growth process to locally increase a thickness of the top portion of the substrate in the first region but not the second region of the substrate;
    forming an isolation ring over a perimeter of the buried insulating material, wherein the buried insulating material and the isolation ring comprise a micro-electromechanical system (MEMS) device region; and
    forming a transistor region in the second region, the second region being without the buried insulating material beneath the top surface.

12. The method according to claim 11, wherein the buried insulating material comprises a thickness of about 100 nm or less and a width of about 1 μm or greater and wherein the buried insulating material is located beneath the top surface of the substrate at a depth of about 50 nm or greater.

13. The method according to claim 11, wherein the isolation ring comprises a rectangular shape in a top view of the substrate.

14. The method according to claim 11, wherein at least one side of the isolation ring comprises a width in a cross-sectional view of about 200 nm or greater.

15. The method according to claim 11, wherein the isolation ring comprises an oxide material and/or a nitride material.

16. A method of manufacturing a semiconductor device, the method comprising:
    selectively implanting oxygen or nitrogen into a first portion of a substrate thereby forming a buried insulating material beneath a top surface of the substrate;
    after implanting the oxygen or the nitrogen, forming an epitaxial layer by using an epitaxial growth process to locally increase a thickness of the first portion of the substrate over the buried insulating material;

removing a top portion of the substrate over a perimeter of the buried insulating material; and filling at least a portion of the removed top portion of the substrate with at least one insulating material;

forming a MEMS device in the first portion of the substrate; and forming an ASIC in a second portion of the substrate, the second portion adjacent the first portion and the second portion being without the buried insulating material.

17. The method according to claim 16, wherein the substrate comprises a bulk semiconductor wafer.

18. The method according to claim 16, wherein the buried insulating material comprises an oxide material or a nitride material.

19. The method according to claim 16, further comprising forming a screening insulating material over the substrate, before implanting the oxygen or the nitrogen into the portion of the substrate.

20. The method according to claim 11, further comprising forming a resonator, an oscillating element, an actuator, a sensor, a switch, or an accelerometer within the isolation ring.

21. The method according to claim 7, wherein the substrate comprises a bulk semiconductor wafer.

22. The method according to claim 11, wherein the substrate comprises a bulk semiconductor wafer.

23. The method according to claim 16, wherein a top surface of the epitaxial layer is above the top surface of the substrate not exposed to the epitaxial process.

24. The method according to claim 16, wherein the epitaxial growth process comprises covering a portion of the top surface of the substrate with a hard mask layer and exposing the remaining uncovered portion of the top surface of the substrate to the epitaxial process.

25. The method according to claim 1, wherein selectively implanting oxygen or nitrogen into the first region of a substrate comprises selectively implanting oxygen into the first region of a substrate.

26. The method according to claim 1, wherein selectively implanting oxygen or nitrogen into a first region of the substrate comprises selectively implanting nitrogen into the first region of a substrate.

27. The method according to claim 16, wherein selectively implanting oxygen or nitrogen into the first portion of the substrate comprises selectively implanting oxygen into the first portion of the substrate.

28. The method according to claim 16, wherein selectively implanting oxygen or nitrogen into the first portion of the substrate comprises selectively implanting nitrogen into the first portion of the substrate.

* * * * *